United States Patent [19]

Munz et al.

[11] 4,200,502
[45] Apr. 29, 1980

[54] METHOD FOR PRODUCING AN ELECTRICAL THIN LAYER CIRCUIT

[75] Inventors: Wolf-Dieter Münz, Freigericht; Siegfried Bock; Hans W. Pötzlberger, both of Munich, all of Fed. Rep. of Germany

[73] Assignee: Siemens Aktiengesellschaft, Berlin and Munich, Fed. Rep. of Germany

[21] Appl. No.: 19,437

[22] Filed: Mar. 12, 1979

[51] Int. Cl.² .................. C25D 11/02; C25D 11/34; H01C 17/06; H05K 3/00
[52] U.S. Cl. .................................. 204/15; 29/620; 29/847; 156/661.1; 204/38 A; 361/402
[58] Field of Search .................. 204/15, 38 A, 192 C, 204/192 EC; 156/659, 661, 657, 667; 29/625, 620, 621; 361/402

[56] References Cited

U.S. PATENT DOCUMENTS

| | | | |
|---|---|---|---|
| 3,386,011 | 5/1968 | Murray, Jr. | 361/402 |
| 3,607,679 | 9/1971 | Melroy | 204/15 |
| 3,718,565 | 2/1973 | Pelletier | 204/192 |
| 3,949,275 | 4/1976 | Muenz | 361/402 |

Primary Examiner—T. M. Tufariello

Attorney, Agent, or Firm—Hill, Van Santen, Steadman, Chiara & Simpson

[57] ABSTRACT

A method is disclosed for producing an electric thin layer circuit comprising at least one capacitor and a conductor path and/or a resistor. The number of masks required for the production of such a thin layer circuit is reduced. First and second layers of tantalum-aluminum alloy where the second layer has a tantalum share lower than the first, are applied on an insulating base. In a first masking and etching technique, areas of the first and second layers are etched off outside the circuit elements. At least the second layer is anodically oxidized and the anodically oxidized surface is covered with a silicon dioxide layer so as to form a two layer dielectric for the capacitor. In a second masking and etching technique, not-required areas of the silicon dioxide layer external to the capacitor are removed. By utilizing the silicon dioxide layer remaining as an etching mask, the not-required areas of the tantalum-aluminum oxide layer and the second tantalum-aluminum layer external to the capacitor are removed. In a third etching and masking technique, a conductive surface layer is applied over the silicon dioxide layer at the capacitor element to form a two-layer dielectric capacitor and over the first tantalum-aluminum layer to form the conductor path.

10 Claims, 4 Drawing Figures

METHOD FOR PRODUCING AN ELECTRICAL THIN LAYER CIRCUIT

BACKGROUND OF THE INVENTION

The invention relates to a method for producing an electrical thin layer circuit comprising at least one capacitor and one conductor path and/or a resistor, in which a layer of a tantalum-aluminum alloy with a tantalum proportion of between 30 and 70 atomic % is first applied onto an insulating substrate in order to form these circuit elements, and thereupon an additional layer of a tantalum-aluminum alloy with a tantalum share having a magnitude of between 2 and 20 atomic % is applied. An interruption is inserted into the two tantalum-aluminum layers with the aid of a first masking and etching technique at the location of a capacitor to be formed whereupon the tantalum-aluminum layers are anodically oxidized in order to produce a two-layer capacitor dielectric. A silicon-dioxide layer is applied onto the resulting tantalum-aluminum oxide layer, and finally an electrically properly conducting surface layer is produced on the capacitor dielectric. This can be done in the area of existing conductor paths with the aid of an additional masking and etching technique.

Up to now the production of integrated RC thin layer circuits in tantalum technique was only possible with the high technological expense of photolithographic processes. Depending upon the specific technological requirements, up to 12 photolithographic processes were required. The essential reason therefore is that the $\beta$-tantalum provided in the tantalum technique as a base electrode for capacitors cannot selectively be etched from the tantalum-oxynitride developed for resistors on the basis of its high chemical stability. Therefore, locally delimited etching barriers are required, which necessarily increase the number of photolithographic processes required.

Utilizing the tantalum-aluminum double-layer technique known, for example, from U.S. Pat. No. 3,949,275, this problem does not exist since the aluminum-rich tantalum-aluminum layer provided as a base electrode for capacitors can readily be selectively etched from the tantalum-aluminum layer provided for resistors.

An additional improvement of the aforementioned tantalum-aluminum double-layer technique was obtained by the introduction of a two-layer capacitor dielectric known from German OS No. 2,506,065. This two-layer capacitor dielectric consists of a tantalum-aluminum oxide-layer produced by an anodic oxidation of the aluminum-rich tantalum-aluminum layer and a silicon-dioxide layer advantageously produced by cathode sputtering. For the RC thin layer circuits produced in accordance with this technology, the absolute values of the temperature coefficients of the resistors can be adjusted to the absolute values of the temperature coefficients of the capacitance. This adjustment results via the relationship $$\alpha = \frac{\frac{E_1}{d_1} \cdot \alpha_2 + \frac{E_2}{d_2} \cdot \alpha_1}{\frac{E_1}{d_1} + \frac{E_2}{d_2}},$$

whereby $\alpha$ = temperature coefficient TKC of the two-layer dielectric,
$\alpha_1$ = temperature coefficient TKC of the tantalum-aluminum oxide layer,
$\alpha_2$ = temperature coefficient TKC of the silicon dioxide layer,
$\epsilon_1$ = dielectric constant of the tantalum-aluminum oxide layer,
$\epsilon_2$ = dielectric constant of the silicon dioxide layer,
$d_1$ = thickness of the tantalum-aluminum oxide layer, and
$d_2$ = thickness of the silicon dioxide layer.

With the aid of this relationship, a suitable thickness $d_2$ of the silicon dioxide layer can be adjusted relative to each arbitrary thickness $d_1$ of the tantalum-aluminum oxide layer, so that the absolute value of the temperature coefficients of the capacitance corresponds with the absolute value of the temperature coefficient of a resistor.

The production of the thin layer circuits having a two-layer capacitor dielectric results in accordance with a method of the initially mentioned type, whereby the formation of the tantalum-aluminum oxide layer is applied with a local delimitation utilizing a dielectric puncture-resistant photomask. With a continued usage of this photomask and also using the lift-off technique, the desired two-layer dielectric consisting of tantalum-aluminum oxide and silicon oxide can be produced with the saving of an additional photomask. Thus, for the production of these thin layer circuits, four masks are required in all, whereby respectively a mask is required for the formation of the interruption, for the formation of resistors, and for the structuring of the surface layer in addition to the aforementioned mask.

SUMMARY OF THE INVENTION

The present invention has the underlying objective—proceeding from the technique according to the German OS No. 2,506,065—to indicate a way which facilitates an additional reduction of the masks required for the production of the thin layer circuits.

This objective with a method of the initially mentioned type is inventively resolved in that with the aid of the first masking and etching technique, the areas of the two tantalum-aluminum layers lying outside of the circuit element areas are etched off. Then the free-lying surfaces of the tantalum-aluminum layers are anodically oxidized over the total surface and are coated with the silicon dioxide layer applied over the total surface. The areas of the silicon dioxide layer which are not required are removed with the aid of a second masking and etching technique and the areas of the tantalum-aluminum oxide layer which are not required and of the tantalum-aluminum layer having the low tantalum proportion are selectively etched off utilizing the remaining silicon dioxide layer as an etching mask, and that subsequently the surface layer is applied.

Thus, with the inventive method not only the resistors but also the capacitor base electrodes are already structured before the application of the surface layer required for the capacitor counterelectrodes and the conductor paths. This facilitates an anodic oxidation of the total structured tantalum-aluminum double-layer without a mask. Since silicon oxide can readily be structured by etching, the silicon dioxide layer can also be applied over the total surface, i.e., without using the lift-off technique. The structural silicon dioxide layer can then be used as an etching mask for the structuring of the tantalum-aluminum oxide layer and for the remaining tantalum-aluminum layer having the low tantalum proportion. Thus, for the production of the thin layer circuit only three masks are required in all. Additionally, the mask required for the structuring of the silicon dioxide layer need only have the temperature stability required for the etching, i.e., it can be produced by utilizing the generally preferred positive photolacquers. A dielectric temperature strength of the mask as required for the locally delimited anodic oxidation is not required. As an additional advantage of the inventive method, no regard need be observed for the high heating of a mask in the total surface application of the silicon dioxide layer in contrast to the lift-off technique. Thus, high sputtering outputs and low sputtering times can be realized for the application with the aid of cathode sputtering. However, for the mounting of the silicon dioxide layer with high sputtering rates, the oxygen loss is exceedingly low during sputtering so that exceedingly low loss factors occur with capacitors thus produced.

For the mask production in the second masking and etching technique, a positive photolacquer is advantageously used. The areas of the silicon dioxide layer which are not required are particularly advantageously removed by means of plasma-etching. It is additionally recommended to use a variety solution of phosphoric acid and chromium acid for the etching-off of the tantulum-aluminum oxide-layer. The areas of the tantalum-aluminum layer which are not required having the low tantalum share or proportion are advantageously etched off in a watery, buffered fluorhydracid.

In one preferred embodiment of the inventive method the base electrode connection of the capacitor is carried out via a narrow path of the tantalum-aluminum layer having the high tantalum share. It is thereby recommended to fashion the base electrode connection in a fork-shape in order to lay out the effective capacitor surface, and to also design the path in a fork-shape. A particularly low-ohmic connection to the capacitor base electrode is obtained with this technique. Then, a width in the magnitude of 50 μm is expediently obtained for the path.

DESCRIPTION OF THE PREFERRED EMBODIMENTS

Figure 1:
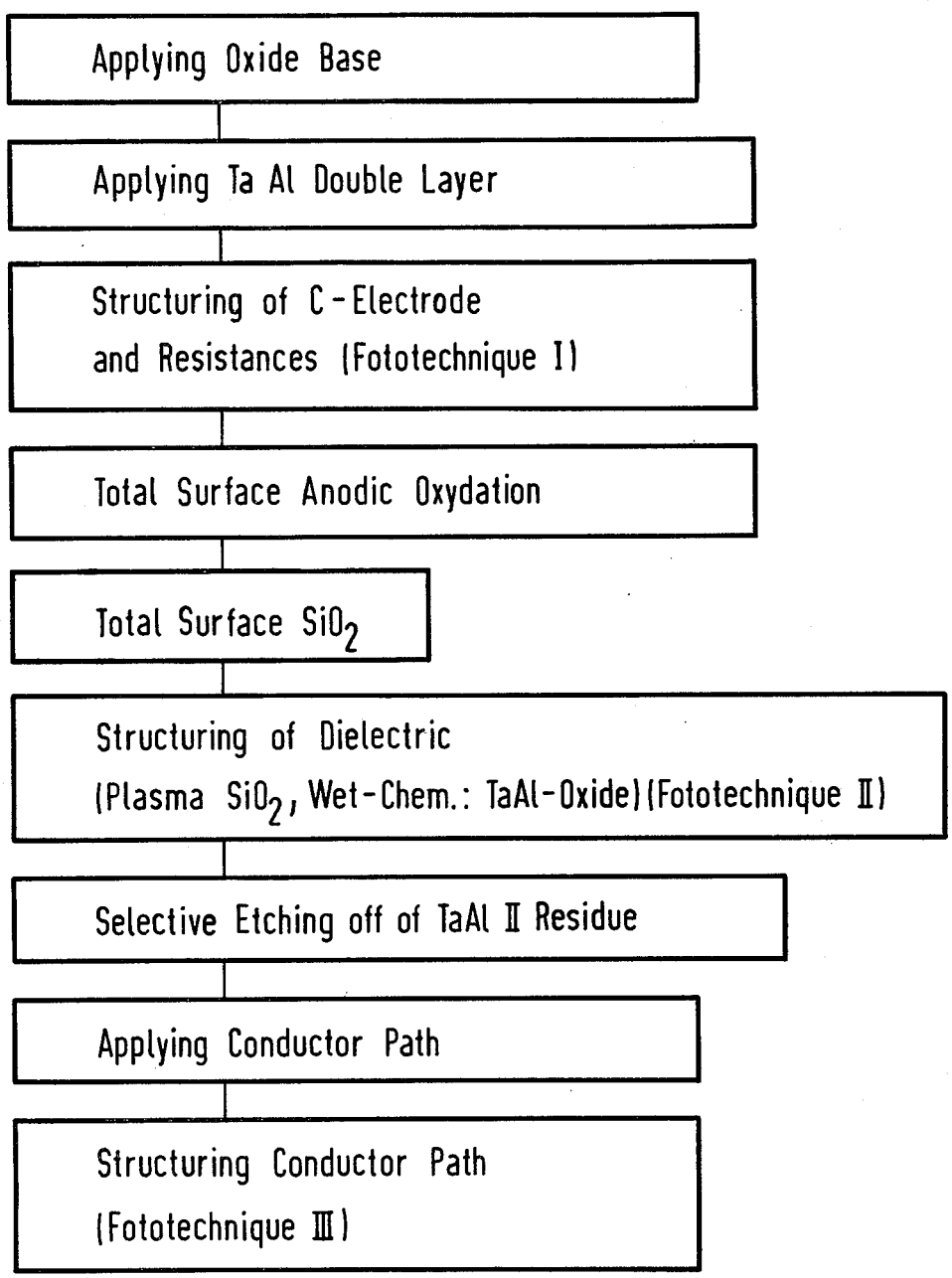
FIG. 1 illustrates a flow diagram of the method steps required in accordance with the inventive method.
Figure 2:
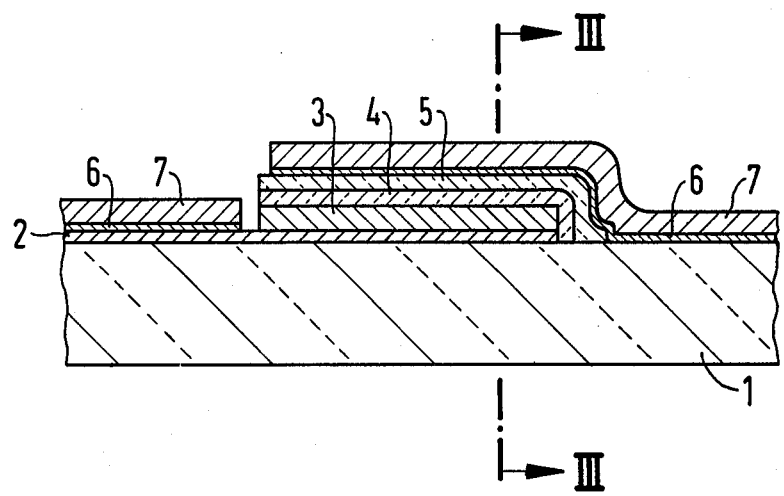
FIG. 2 shows a longitudinal section in the capacitor area through a thin layer circuit produced in accordance with the inventive method.
Figure 3:
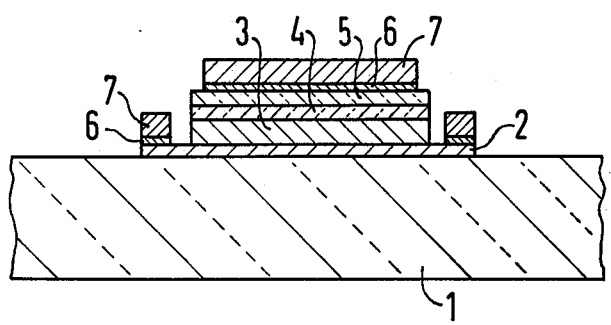
FIG. 3 shows a section in accordance with lines III—III of FIG. 2.
Figure 4:
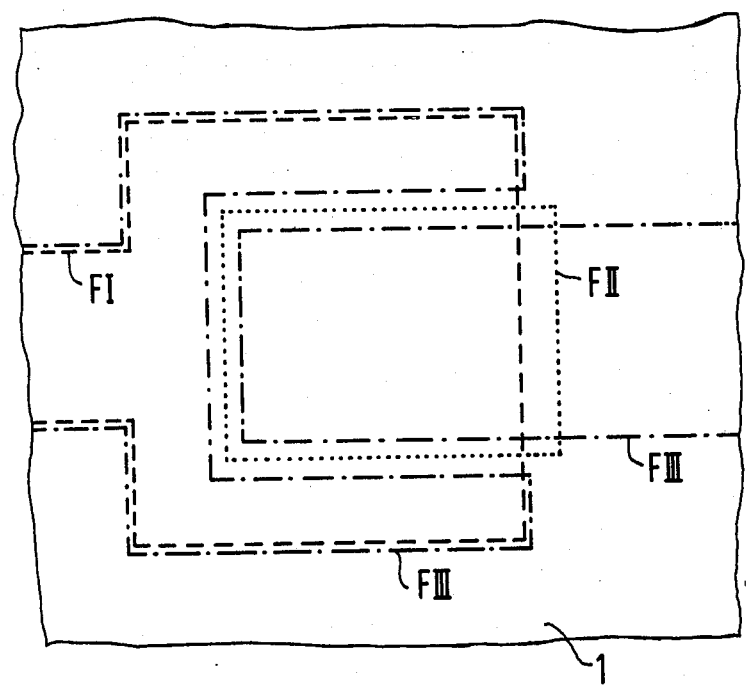
FIG. 4 shows a top view of the thin layer circuit illustrated in FIGS. 1 and 2, in which the position of the mask necessary for the production is schematically shown.

In the subsequent description of the sample embodiment, one proceeds from the flow diagram illustrated in FIG. 1 with reference to the thin layer circuit illustrated in FIGS. 2 and 3 and also the schematic illustration of FIG. 4. In accordance with FIG. 1, an insulating base is provided as an initial base, which, for example, can be produced by means of applying an oxide onto a non-conducting carrier. As assumed in FIGS. 2 and 3, one can also proceed from a completed insulating base 1 which, for example, consists of glass, quartz, sapphire or a fine-grained polished ceramic. A TaAl double layer is applied to the base 1, which consists of a tantalum-aluminum alloy layer 2 having tantalum content of 30 through 70, advantageously 60 atomic % and a tantalum-aluminum alloy layer 3 having a tantalum content in the magnitude of between 2 and 20, advantageously 7 atomic %. The application of the tantalum-aluminum alloy layers 2 and 3 proceeds in a manner per se known, for example, with the aid of cathode sputtering.

The base thus prepared is now covered with a mask which, for example, can be produced photolithographically with the aid of a positively effecting photolacquer. This mask production is referenced phototechnique I, whereby the position of the mask is indicated by the dashed line FI in the top view of FIG. 4. The mask covers all of the areas corresponding with the capacitor base electrodes, resistors and conductor paths to be produced, so that the remaining areas of the tantalum-aluminum alloy layers 2 and 3 can be etched-off by one etching step or by two successive etching steps. With two subsequent selective etching steps an underetching of the tantalum-aluminum alloy layers 2 and 3 is avoided. A watery buffered fluorhydracid, for example, can be used for the structuring of the tantalum-aluminum alloy layer 3, whereas a watery hydrofluoric acid—nitric acid solution can be used as etching means for the structuring of the tantalum-aluminum alloy layer 2.

After removing the mask formed by phototechnique I, a total surface anodic oxidation is undertaken in which the surface area of the tantalum-aluminum alloy layer 3 is transformed into a tantalum-aluminum oxide layer 4. In the interruption following the capacitor area, the tantalum-aluminum oxide layer 4 in accordance with FIG. 2 also extends over the free frontal side of the tantalum-aluminum alloy layer 2. The production of the tantalum-aluminum oxide layer 4 by anodic oxidation is undertaken, for example, in a watery citric acid solution having a constant current density of 1 mA/cm$^2$ until a formation voltage of approximately 200 volts is formed.

After the anodic oxidation, a total-surface silicon dioxide layer 5 is applied onto the base, advantageously with the aid of cathode sputtering.

Subsequently a second mask is mounted onto the silicon dioxide layer 5, said mask which is advantageously photolithographically produced with the aid of a positively-acting photolacquer. This mask production is referenced photolacquer II, whereby the position of the second mask is indicated by the dotted line F II. The second mask covers the dielectric region of the capacitors to be produced so that the remaining areas of the silicon dioxide layer 5 and of the tantalum-aluminum oxide layer 4 can be etched off by two successive selective etching steps. The structuring of the silicon dioxide layer 5 can also be undertaken wet-chemically, but advantageously proceeds via plasma etching. A corresponding structuring of the tantalum-aluminum oxide layer 4 results after wet-chemically removing the second photomask, for example, in a watery solution of 5% phosphoric acid ($H_3PO_4$) and 3% chromium acid ($CrO_3$) at a temperature of 85° C. For this etching process the remaining silicon dioxide layer 5 is used as an etching mask.

The residual areas of the tantalum-aluminum alloy layer 3 not required for the capacitor base electrodes are etched off in an additional selective etching process whereby the remaining silicon-dioxide layer 5 is again used as an etching mask. The watery buffered fluorhydracid already mentioned can be used as an etching means. The removal of the second mask can also proceed after this selective etching process as it covers the same areas as the remaining silicon dioxide layer 5.

In the subsequent method step an electrically properly conducting surface layer is mounted over the total surface in order to form the conductor paths and the capacitor counterelectrodes. This mounting is undertaken, for example, by a successively resulting vaporization of a nickel-chromium layer 6 and a gold layer 7.

The surface layer is structured during the last method step. A third mask is applied onto the gold layer 7, said mask which, for example, can photolithographically be produced with the aid of a positively acting photolacquer. This mask production is referenced photolacquer III, whereby the position of the third mask is indicated by dash-dotted lines FIII in the top view of FIG. 4. The third mask covers the areas of the conductor path and of the capacitor counter electrodes so that the remaining areas of the gold layer 7 and of the nickel-chromium layer 6 can be etched off. The structuring of the gold layer 7 results, for example, in a watery potassium-iodide-iodine solution as etching means, whereas the structuring of the nickel-chromium layer 6 can be undertaken in a watery cer-sulfate solution. After these selective etching processes only the third mask need be removed in order to complete the thin layer circuit.

As is obvious from FIGS. 2 and 3, the base electrode connection of the capacitor is designed in a fork-shape in order to obtain a low-ohmic connection, whereby the connection of the corresponding areas of the nickel-chromium layer 6 and of the gold layer 7 proceeds with the area of the tantalum-aluminum alloy layer 3 remaining as a capacitor base electrode via a narrow, for example, 50 μm wide path of the tantalum-aluminum alloy layer 2.

No resistors are illustrated in FIGS. 2 and 3 as they receive the design conventional for thin layer technique and are knwon, for example, from U.S. Pat. No. 3,949,275. As is clearly obvious from the aforementioned specification, they are formed from the tantalum-aluminum alloy layer 2 and are already structured by the phototechnique I. The previously mentioned path of the tantalum-aluminum alloy layer 2 can, for example, also be considered a resistor arranged in series with the capacitor with a correspondingly wide design.

The inventive method facilitates the production of thin layer circuits with a particularly economical production technique, said circuits which are particularly suited for the low frequency range. In a thin layer circuit designed in accordance with FIGS. 2 and 3, in which the tantalum-aluminum alloy layer 2 consists of 60 atomic % Ta and of 40 atomic % Al, the tantalum-aluminum alloy layer 3 consists of 7 atomic % Ta and 93 atomic % Al. The tantalum-aluminum oxide layer 4 is designed with a thickness of 280 nm with a formation voltage of 200 volts. The silicon dioxide layer 5 exhibits a thickness of 300 nm, the nickel-chromium layer 6 exhibits a thickness of 50 nm, and the gold layer 7 exhibits a thickness of 500 nm. In the above structure, the following technical data, for example, is realized:

| Resistors: | Surface resistance $R_F = 100\Omega/\square$ |
|---|---|
| | TKR = $-110 \pm 20$ ppm/°C. |
| Capacitors: | Specific capacitance $C_{spec} = 10$ nF/cm$^2$ |
| | Loss angle $\tau g \delta 1 kHz < 1.5°/oo$ |
| | *-continued* |
| | TKC = $+110 \pm 20$ ppm/°C. |

TKR and TKC refer to the temperature coefficients of the resistors or capacitors.

Although various minor modifications may be suggested by those versed in the art, it should be understood that we wish to embody within the scope of the patent warranted hereon, all such embodiments as reasonably and properly come within the scope of our contribution to the art.

We claim as our Invention:

1. A method for producing an electric thin layer circuit comprising circuit elements including at least one capacitor and a conductor path comprising the steps of:
   (a) providing an insulating layer and applying a first layer of a tantalum-aluminum alloy having a tantalum share of between 30 and 70 atomic % on the insulating layer;
   (b) applying a second layer of a tantalum-aluminum alloy having a tantalum share of between 2 and 20 atomic % on the first layer;
   (c) forming circuit elements by a first masking and etching technique by etching off areas of the first and second layers outside the circuit elements by at least one etching;
   (d) anodically oxidizing an exposed surface of the first and second layers to form a tantalum-aluminum oxide layer and coating the anodically oxidized surface with a silicon dioxide layer;
   (e) removing by a second masking and etching technique not-required areas of the silicon dioxide layer external to the capacitor;
   (f) by utilizing the remaining silicon dioxide layer as an etching mask, selectively etching off the not-required areas of the tantalum-aluminum oxide layer and the second tantalum-aluminum layer external to the capacitor; and
   (g) by a third etching and masking technique applying a conductive surface layer over the silicon dioxide layer at the capacitor element to form a two-layer dielectric capacitor and over the first tantalum-aluminum layer to form the conductor path.

2. A method according to claim 1 comprising the step of using a positive photolacquer for mask production in the second masking and etching technique.

3. A method according to claim 1 comprising the step of removing the not-required areas of the silicon dioxide layer by plasma-etching.

4. A method according to claim 1 comprising the step of etching off the not-required areas of the tantalum-aluminum oxide layer in a watery solution of phosphoric acid and chromic acid.

5. A method according to claim 1 comprising the step of etching off the not-required areas of the second tantalum-aluminum layer having the low tantalum share in a watery buffered fluorhydracid.

6. A method according to claim 1 comprising the step of providing a base electrode connection of the capacitor with a narrow path of the first tantalum-aluminum layer having the high tantalum share.

7. A method according to claim 6 comprising the step of laying out the base electrode connection as a narrow path about an effective capacitor surface in a fork-shape.

8. A method according to claim 7 comprising the step of selecting a width in the magnitude of 50 μm for the narrow path.

9. The method of claim 1 wherein the conductor path is provided as a resistor.

10. A method for producing an electric thin layer circuit comprising circuit elements including at least one capacitor and a conductor path, comprising the steps of:
(a) providing an insulating base and depositing thereon a first tantalum-aluminum alloy layer having a tantalum content of 30 to 70 atomic % and depositing on the first layer a second tantalum-aluminum alloy layer having a tantalum content between 2 and 20 atomic %;
(b) covering the base with a mask in a first phototechnique and etching off areas of the first and second alloy layers external to the capacitor and conductor path to be produced;
(c) undertaking an anodic oxidation for transforming the surface area of the second alloy layer into a tantalum-aluminum oxide layer;
(d) applying a silicon dioxide layer onto the base;
(e) in a second phototechnique, mounting a second mask on the silicon dioxide layer so that areas of the silicon dioxide layer can be etched off external to a dielectric region of the capacitor, and the tantalum-aluminum oxide layer areas external to the dielectric region can be etched off by using the remaining silicon dioxide layer as an etching mask;
(f) applying a conductive surface layer over the base and in a third phototechnique, and by use of a third mask, the conductive surface layer is structured so as to provide a conductor path and a capacitor counter electrode.

* * * * *